(12) United States Patent
Huang

(10) Patent No.: US 10,170,717 B2
(45) Date of Patent: Jan. 1, 2019

(54) THIN FILM TRANSISTOR AND MANUFACTURING METHOD THEREOF, DISPLAY SUBSTRATE, AND DISPLAY APPARATUS

(71) Applicant: BOE TECHNOLOGY GROUP CO., LTD., Beijing (CN)

(72) Inventor: Wei Huang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/511,653

(22) PCT Filed: Apr. 5, 2016

(86) PCT No.: PCT/CN2016/078424
§ 371 (c)(1),
(2) Date: Mar. 16, 2017

(87) PCT Pub. No.: WO2016/202050
PCT Pub. Date: Dec. 22, 2016

(65) Prior Publication Data
US 2018/0114933 A1 Apr. 26, 2018

(30) Foreign Application Priority Data
Jun. 15, 2015 (CN) .......................... 2015 1 0329297

(51) Int. Cl.
*H01L 21/336* (2006.01)
*H01L 51/10* (2006.01)
(Continued)

(52) U.S. Cl.
CPC .............. *H01L 51/10* (2013.01); *H01L 23/24* (2013.01); *H01L 23/3737* (2013.01);
(Continued)

(58) Field of Classification Search
CPC ................................................... H01L 27/3262
See application file for complete search history.

(56) References Cited

U.S. PATENT DOCUMENTS

2004/0004214 A1\* 1/2004 Yamazaki ........... H01L 51/5256
257/40
2004/0097635 A1 5/2004 Fan et al.
(Continued)

FOREIGN PATENT DOCUMENTS

| CN | 1501483 A | 6/2004 |
|----|-----------|--------|
| CN | 1897308 A | 1/2007 |

(Continued)

OTHER PUBLICATIONS

First Office Action for Chinese Application No. 201510329297.0, dated May 27, 2017, 6 Pages.
(Continued)

*Primary Examiner* — Thao P Le
(74) *Attorney, Agent, or Firm* — Brooks Kushman P.C.

(57) ABSTRACT

Provided is a thin film transistor and a manufacturing method thereof, a display substrate and a display apparatus. The thin film transistor includes a source electrode pattern and a drain electrode pattern arranged on a same layer and a heat dissipation layer arranged between the source electrode pattern and the drain electrode pattern.

19 Claims, 2 Drawing Sheets

(51) Int. Cl.
  H01L 23/24    (2006.01)
  H01L 29/786   (2006.01)
  H01L 27/12    (2006.01)
  H01L 27/32    (2006.01)
  H01L 23/373   (2006.01)
  H01L 27/28    (2006.01)
  H01L 51/00    (2006.01)
  H01L 51/05    (2006.01)

(52) U.S. Cl.
  CPC ............ *H01L 27/12* (2013.01); *H01L 27/283* (2013.01); *H01L 27/32* (2013.01); *H01L 29/786* (2013.01); *H01L 51/0034* (2013.01); *H01L 51/0048* (2013.01); *H01L 51/052* (2013.01); *H01L 51/0529* (2013.01); *H01L 51/0541* (2013.01); *H01L 51/0558* (2013.01); *H01L 27/3274* (2013.01)

(56) References Cited

U.S. PATENT DOCUMENTS

| | | | |
|---|---|---|---|
| 2005/0211985 A1* | 9/2005 | Chin-Lung | H01L 29/66757 257/72 |
| 2007/0013005 A1 | 1/2007 | Hara | |
| 2007/0085081 A1* | 4/2007 | Choa | H01S 5/0216 257/79 |
| 2010/0065851 A1* | 3/2010 | Makita | H01L 27/12 257/72 |
| 2011/0006312 A1* | 1/2011 | Hsu | H01L 25/167 257/88 |
| 2011/0037124 A1 | 2/2011 | Liu et al. | |
| 2011/0109596 A1* | 5/2011 | Yoon | H01L 27/3272 345/204 |
| 2014/0008649 A1* | 1/2014 | Umeda | H01L 29/7869 257/43 |
| 2017/0110681 A1* | 4/2017 | Shen | H01L 27/3248 |

FOREIGN PATENT DOCUMENTS

| | | |
|---|---|---|
| CN | 101997035 A | 3/2011 |
| CN | 104900713 A | 9/2015 |
| JP | H05206468 A | 8/1993 |
| JP | 2003131588 A | 5/2003 |
| KR | 20050062270 A | 6/2005 |

OTHER PUBLICATIONS

International Search Report and Written Opinion for Application No. PCT/CN2016/078424, dated Jun. 30, 2016, 9 Pages.

Han-Wen Liu et al., Turn-Around Phenomenon in the Degradation Trend of n-Type Low-Temperature Polycrystalline Silicon Thin-Film Transistors under DC Bias Stress, Japanese Journal of Applied Physics, Department of Electrical Engineering and Institute of Electrical Engineering, and Graduate Institute of Optoelectric Engineering, National Chung Hsing University, Taiwan, published Jul. 20, 2010, 4 pages.

Te-Chih Chen et al., Self-heating enhanced charge trapping effect fo InGaZnO thin film transistor, Applied Physics Letters, American Institute of Physics, Taiwan, published Jul. 23, 2012, 5 pages.

M. H. Lee, The Operation of a-Si:H TFTs Flexible Electronics on Plastic Substrate, ISDRS, Maryland, published Dec. 12-14, 2007, 2 pages.

Michael L. Chabinyc, Short Channel effects in regioregular poly(thiophene) thin film transistors, Journal of Applied Physics, American Institute of Physics, published Aug. 15, 2004, 9 pages.

* cited by examiner

THIN FILM TRANSISTOR AND MANUFACTURING METHOD THEREOF, DISPLAY SUBSTRATE, AND DISPLAY APPARATUS

CROSS-REFERENCE TO RELATED APPLICATIONS

This application is the U.S. national phase of PCT Application No. PCT/CN2016/078424 filed on Apr. 5, 2016, which claims priority to Chinese Patent Application No. 201510329297.0 filed on Jun. 15, 2015, the disclosures of which are incorporated in their entirety by reference herein.

TECHNICAL FIELD

The present disclosure relates to the field of display technology, and more particularly to a thin film transistor and a manufacturing method thereof, a display substrate and a display apparatus.

BACKGROUND

In the recent years, an organic light emitting diode (OLED), also known as an organic electroluminescence display, has become a main display type of flexible displays due to its various advantages.

A flexible OLED display has a high demand on the uniformity and the reliability of a threshold voltage (Vth) of a thin film transistor (TFT), i.e., an electrical bias threshold voltage drift (bias stress) characteristic. Generally, it is required that the drift of the threshold voltage (ΔVth) is less than 0.3V. Therefore, a control of electrical bias threshold voltage drift and a structure improvement/a process improvement of the flexible thin film transistor and the like have become the technology development trend of flexible TFT-driven OLED displays.

A self-heating effect is a major cause of the electrical bias threshold voltage drift generated by the thin film transistor. For a thin film transistor of a high resolution and a short channel, the self-heating effect is more obvious, and the maximum leakage currents (Ids) of the thin film transistor may be four to five times larger than the minimum Ids due to the self-heating effect.

How to avoid the self-heating effect is one of the technical problems to be solved in the art.

SUMMARY

The present disclosure provides a thin film transistor and a manufacturing method thereof, a display substrate and a display apparatus, which may effectively reduce an impact of a self-heating effect on the thin film transistor.

In one aspect, the present disclosure provides in some embodiments a thin film transistor including a source electrode pattern and a drain electrode pattern arranged on a same layer. The thin film transistor further includes a heat dissipation layer arranged between the source electrode pattern and the drain electrode pattern.

Optionally, the heat dissipation layer is made of a polymer carbon nanotube composite material.

Optionally, the polymer carbon nanotube composite material is an insulative material.

Optionally, a top surface of the heat dissipation layer is coated with a hydrophobic organic film layer; or the top surface of the heat dissipation layer is subjected to plasma treatment.

Optionally, the thin film transistor further includes: a substrate; and a buffer layer arranged on the substrate. The source electrode pattern, the drain electrode pattern and the heat dissipation layer are arranged on the buffer layer.

Optionally, the thin film transistor further includes: an organic semiconductor layer arranged on the source electrode pattern, the drain electrode pattern and the heat dissipation layer; a first organic dielectric insulation layer arranged on the organic semiconductor layer; and a gate electrode layer arranged on the first organic dielectric insulation layer.

Optionally, the thin film transistor further includes: a second organic dielectric insulation layer arranged between the first organic dielectric insulation layer and the gate electrode layer.

Optionally, the polymer carbon nanotube composite material is a material formed by filling pore passages which are evenly or unevenly distributed in an insulative polymer matrix with carbon nanotubes gathered through a phase separation effect.

In another aspect, the present disclosure further provides in some embodiments a manufacturing method of a thin film transistor, the thin film transistor includes a source electrode pattern and a drain electrode pattern arranged on a same layer. The method includes forming a heat dissipation layer pattern having a predetermined electrical conductivity between the source electrode pattern and the drain electrode pattern.

Optionally, the heat dissipation layer is made of a polymer carbon nanotube composite material.

Optionally, the polymer carbon nanotube composite material is a material formed by filling pore passages evenly or unevenly distributed in an insulative polymer matrix with carbon nanotubes gathered through a phase separation effect.

Optionally, the method further includes coating a top surface of the heat dissipation layer with a hydrophobic organic film layer; or subjecting the top surface of the heat dissipation layer to plasma treatment.

Optionally, before forming the heat dissipation layer pattern, the method further includes forming a buffer layer pattern on a substrate; and forming the source electrode pattern and the drain electrode pattern on the buffer layer pattern.

Optionally, the method further includes forming an organic semiconductor layer pattern on the source electrode pattern, the drain electrode pattern and the heat dissipation layer pattern; forming a first organic dielectric insulation layer pattern on the organic semiconductor layer pattern; and forming a gate electrode layer pattern on the first organic dielectric insulation layer pattern.

Optionally, before the forming the gate electrode layer pattern, the method further includes forming a second organic dielectric insulation layer pattern on the first organic dielectric insulation layer pattern. The gate electrode layer pattern is arranged on the second organic dielectric insulation layer.

In yet another aspect, the present disclosure further provides in some embodiments a display substrate including the above thin film transistor according to embodiments of the present disclosure.

In still another aspect, the present disclosure further provides in some embodiments a display apparatus including the above display substrate according to the embodiments of the present disclosure.

It can be seen from the above description that, according to the thin film transistor and the manufacturing method thereof, the display substrate and the display apparatus according to the present disclosure, by forming the heat dissipation layer having a predetermined electrical conductivity between the source electrode pattern and the drain electrode pattern arranged on a same layer of the thin film transistor, an impact of the self-heating effect on the thin film transistor may be effectively reduced, thus ensuring an image display quality of the display apparatus.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

It is found by the inventor based on research that, generations of self-heating effect mainly concentrated at an interface between a gate electrode and a gate insulation layer (GI), a substrate having a poor heat conductivity (e.g., a plastic substrate) and a channel region of a TFT. With regard to the self-heating effect between the gate electrode and the gate insulation layer, the self-heating effect at the interface may be effectively improved by adding a heat conduction layer, such as a Cu thin film layer, to an adjacent position, such as a gate electrode. With regard to the plastic substrate having a poor heat conductivity, the self-heating effect may also be effectively improved by adding an insulating layer, such as a buffer layer as commonly used in a TFT backplane technology, between the gate electrode and the plastic substrate. With regard to a self-heating effect due to a current in the channel region, there is no effective technical mean currently available for realizing effective heat derivation.

Particularly, with regard to a top gate type TFT, especially, an organic TFT, the heat conduction efficiency is negatively affected due to the block of a semiconductor layer (active layer), a buffer layer and a planarization layer etc.

Figure 1:
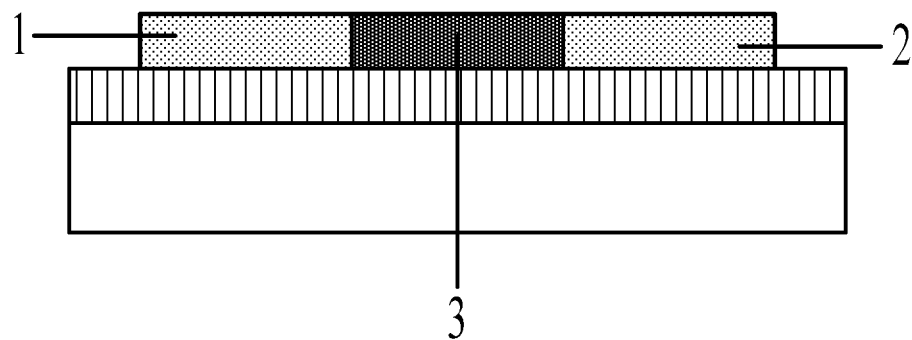
FIG. 1 is a schematic diagram showing a thin film transistor according to some embodiments of the present disclosure.

Embodiments of the present disclosure provide a thin film transistor, as shown in FIG. 1. Specifically, the thin film transistor may include a source electrode 1 pattern and a drain electrode 2 pattern arranged on a same layer.

As shown in FIG. 1, the thin film transistor may further include a heat dissipation layer 3 arranged between the source electrode pattern 1 and the drain electrode pattern 2 and having a predetermined electric conductivity.

According to the thin film transistor of embodiments of the present disclosure, by forming the heat dissipation layer 3 in a channel region of the TFT where the self-heating effect is obvious, a heat dissipation and a heat transmission in the channel region may be accelerated, thus effectively improving the impact of self-heating effect on the thin film transistor, and ensuring an image display quality of the display apparatus.

The material of the heat dissipation layer 3 according to embodiments of the present disclosure may be a material having a good heat conductivity. Meanwhile, the material also needs to have a low electrical conductivity, so as to control a leakage current between the source electrode pattern 1 and the drain electrode pattern 2 at both ends of the heat dissipation layer 3.

The inventor measures heat conductivities and electrical conductivities of several substances, and the specific results are as shown in table 1.

TABLE 1

| Material | Heat conductivity (W/mK) | Electrical conductivity (S/m) |
| --- | --- | --- |
| Aluminium nitride (AlNx) | 170-190 | 1e−12 |
| Beryllium oxide | 218-300 | 1e−12 |
| Copper (Cu) | 380-400 | 1e7~1e8 |
| Air | 0.024-0.025 | 1e−14 |
| Diamond (impure) | 1000 | 1e−16 |
| Diamond (natural) | 2200 | 1e−16 |
| Glass | 0.8-0.93 | 1e−12~1e−14 |
| Carbon nanotube (bulk) | 35-200 | 1e−1~1e−4 |
| Carbon nanotube (single) | 3180-3500 | e−16 (insulator) 1e8 (conductor) |
| silicon oxide | 0.014 | 1e−13 |
| Silicon nitride | 0.185 | 1e−10~1e−12 |
| Plastic | 0.02-0.5 | 1e0~1e−16 |
| Water | 0.56-0.61 | 1e−3~1e−6 |

It can be seen from the analysis and comparison of characteristics of the substances in the above table that, the characteristics of heat conductivity and electrical conductivity that the carbon nanotube (insulator) satisfies the requirement of the heat dissipation layer 3. In addition, the carbon nanotube further possesses advantages of being capable of solution processing, good mechanical property, good heat conductivity etc. Therefore, in one embodiment, the heat dissipation layer 3 may be a polymer carbon nanotube composite material.

In embodiments of the present disclosure, the heat dissipation layer 3 may be formed by forming one layer or several layers of thin films of polymer carbon nanotube composite material.

Specifically, the polymer carbon nanotube composite material may be formed by filling pore passages, which are evenly or unevenly distributed in an insulative polymer matrix, with carbon nanotubes gathered through a phase separation effect, which enables the heat dissipation layer 3 to have the characteristics of high heat conductivity, low electrical conductivity and high flexing endurance. Therefore, the self-heating effect of the thin film transistor may be effectively reduced, and the electrical bias threshold voltage drift (bias stress) characteristic of the thin film transistor may be improved. Meanwhile, adopting this material further has advantages of simple process, being capable of mass production etc. Due to the above advantages, the thin film transistor according to the embodiments of the present disclosure has a great utilization potential in display panels (e.g. flexible display panels), printable semiconductor electronic component, sensing component etc.

In some embodiments of the present disclosure, the organic semiconductor solution and the organic polymer dielectric material solution may be successively deposited at a position where the heat dissipation layer 3 (i.e., the channel region of the TFT) is located, by using, but not limited to, a solution processing method such as inkjet printing, drop casting, spin coating, and finishing the corresponding patterning.

In embodiments of the present disclosure, in order to optimize a surface energy distribution of the heat dissipation layer 3 so as to increase a growth quality of the organic semiconductor film, certain treatment may also be performed on the surface of the heat dissipation layer 3 made of polymer carbon nanotube composite material, for example, coating a top surface of the heat dissipation layer 3 with a hydrophobic organic film layer or subjecting the top surface of the heat dissipation layer 3 to plasma treatment.

Figure 2:
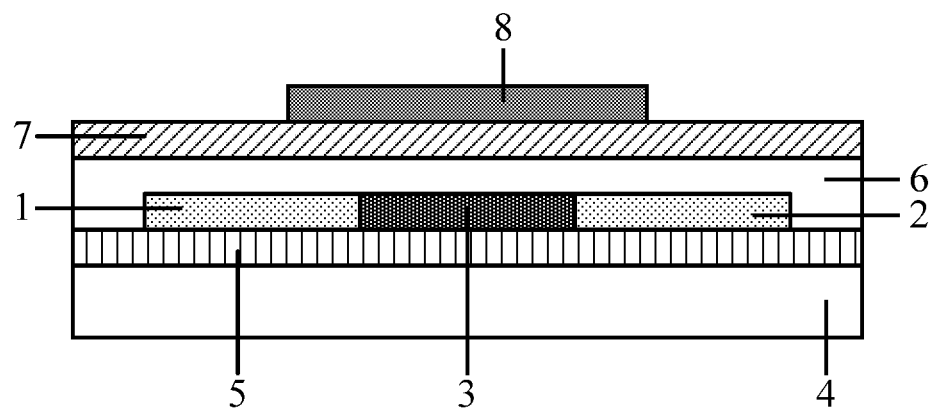
FIG. 2 is a schematic diagram showing a thin film transistor according to some embodiments of the present disclosure.

As shown in FIG. 2, specifically, in addition to the source electrode 1, the drain electrode 2 and the heat dissipation layer 3, the thin film transistor according to the embodiments of the present disclosure may further include a substrate 4; a buffer layer 5 arranged on the substrate 4, wherein the source electrode 1, the drain electrode 2 and the heat dissipation layer 3 are arranged on the buffer layer 5; an organic semiconductor layer (OSC) 6 arranged on the source electrode 1, the drain electrode 2 and the heat dissipation layer 3; a first organic dielectric insulation layer (OGI) 7 arranged on the organic semiconductor layer 6; and a gate electrode layer 8 arranged on a second organic dielectric insulation layer 7.

In the thin film transistor as shown in FIG. 2, the technical solution according to embodiments of the present disclosure is explained by taking a top-gate bottom-contacted organic thin film transistor as an example. However, in the practical application, the thin film transistor may also be other types, such as a bottom gate thin film transistor. That is, in embodiments of the present disclosure, pattern layers except the heat dissipation layer 3, the source electrode 1 and the drain electrode 2 may be further arranged based on needs.

Figure 3:
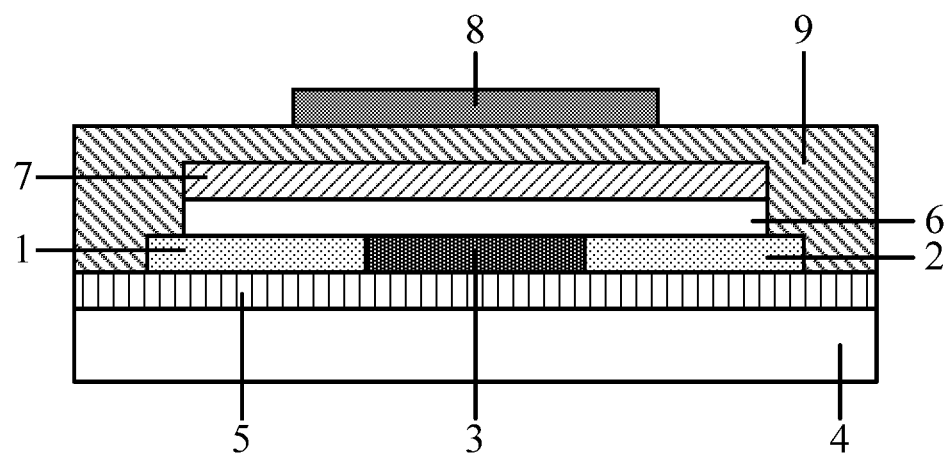
FIG. 3 is a schematic diagram showing a thin film transistor according to some embodiments of the present disclosure.

In some embodiments, with regard to the top gate bottom contacted organic TFT flexible backplane, in order to improve an image display quality, and reduce a current leakage of an array backplane, usually the semiconductor layer of TFT structure needs to be patterned. For example, with regard to the deposited organic semiconductor layer (OSC) 6 and the first organic dielectric insulation layer (OGI) 7, the organic semiconductor layer 6 and the first organic dielectric insulation layer 7 may also be patterned by means of lithography, laser/plasma etching and the like to reduce the current leakage (Ids) in non-channel regions, and then a second organic dielectric insulation layer 9 may be deposited, and a gate electrode 8, a planarization layer (not shown) and the like are formed on the second organic dielectric insulation layer 9. The structure of the thin film transistor may be as shown in FIG. 3.

According to some embodiments of the present disclosure, the thin film transistor may further include the second organic dielectric insulation layer 9 arranged on the first organic dielectric insulation layer 7. The gate electrode 8 is arranged on the second organic dielectric insulation layer 9.

The present disclosure further provides in some embodiments a manufacturing method of a thin film transistor. The thin film transistor includes a source electrode pattern 1 and a drain electrode pattern 2 arranged on a same layer.

The method further includes a step of, forming a heat dissipation layer pattern 3 between the source electrode pattern 1 and the drain electrode pattern 2. The heat dissipation layer 3 has a predetermined electrical conductivity.

In some embodiments, before the step of forming the heat dissipation layer pattern 3, the method further includes steps of: forming a buffer layer pattern 5 on a substrate 4; and forming a source electrode pattern 1 and a drain electrode pattern 2 on the buffer layer pattern 5.

In some embodiments, the method further includes a step of: coating a top surface of the heat dissipation layer 3 with a hydrophobic organic film layer; or subjecting the top surface of the heat dissipation layer 3 to plasma treatment.

In one specific embodiment, the method further includes steps of: forming an organic semiconductor layer pattern 6 on the source electrode pattern 1, the drain electrode pattern 2 and the heat dissipation layer pattern 3; forming a first organic dielectric insulation layer pattern 7 on the organic semiconductor layer pattern 6; and forming a gate electrode layer pattern 8 on the first organic dielectric insulation layer pattern 7.

Next, an embodiment of the manufacturing method of the thin film transistor according to embodiments of the present disclosure will be described in detail by taking a top gate bottom contact thin film transistor as an example.

1. Depositing an insulated and low-stressed buffer layer pattern 5 on a flexible or rigid base substrate 4.

In the embodiment of the present disclosure, the forming process of the buffer layer pattern 5 is not limited. Specifically, the buffer layer pattern 5 may be formed by adopting any mature manufacturing technology, for example, by using, but not limited to, one or several methods selected from the group consisting of lithography, printing, metal mask plate (shadow mask) evaporation etc.

Figure 4:
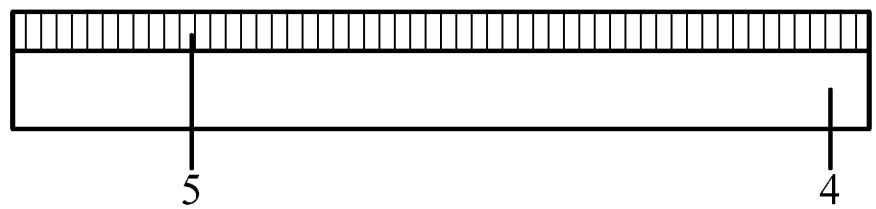
FIG. 4 is a schematic diagram showing a thin film transistor according to some embodiments of the present disclosure.

At this time, the thin film transistor may be as shown in FIG. 4.

2. Forming a source electrode pattern 1 and a drain electrode pattern 2.

Figure 5:
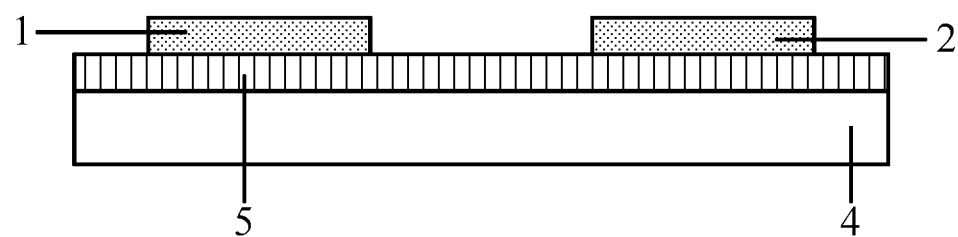
FIG. 5 is a schematic diagram showing a thin film transistor according to some embodiments of the present disclosure.

At this time, the thin film transistor may be as shown in FIG. 5.

3. Depositing evenly-mixed solution of carbon nanotube, monomers and oligomers, initiator, dopant etc. (or other substances that can form the polymer carbon nanotube composite material) in a channel region (i.e., a region between the source electrode pattern 1 and the drain electrode pattern 2) of the thin film transistor by using, but not limited to, a solution processing method such as inkjet printing, drop casting, spin coating. Irradiating the solution with ultraviolet light or other heat sources to induce a polymerization phase separation (i.e., a separation period), and finally forming a polymer carbon nanotube composite material film layer made of insulative polymers and heat-conductive carbon nanotubes, i.e., a heat dissipation layer 3.

Figure 6:
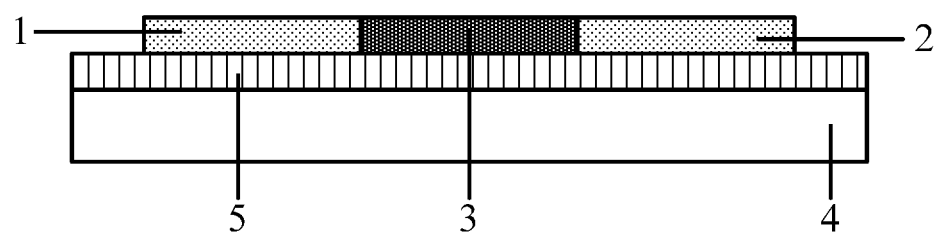
FIG. 6 is a schematic diagram showing a thin film transistor according to some embodiments of the present disclosure.

At this time, the thin film transistor may be as shown in FIG. 6.

4. Forming an organic semiconductor layer 6 (OSC) and a first organic dielectric insulation layer pattern 7 (OGI) successively.

5. Forming a gate electrode layer pattern 8.

Finally, the thin film transistor as shown in FIG. 2 is formed.

Moreover, in some embodiments of the present disclosure, before the step of, forming the gate electrode layer pattern 8, a second organic dielectric insulation layer pattern 9 may be formed on the existing thin film transistor structure (e.g., the organic semiconductor layer 6 and the first organic dielectric insulation layer pattern 7), and then the gate electrode layer 8 pattern is formed, and finally the thin film transistor structure as shown in FIG. 3 is formed.

The present disclosure further provides in some embodiments a display substrate, including the above thin film transistor.

The present disclosure further provides in some embodiments a display apparatus including the above display substrate.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A thin film transistor, comprising a source electrode pattern and a drain electrode pattern arranged on a same layer, wherein the thin film transistor further comprises:
   a heat dissipation layer arranged between the source electrode pattern and the drain electrode pattern,
   wherein the heat dissipation layer is made of a polymer carbon nanotube composite material.

2. The thin film transistor according to claim 1, wherein the polymer carbon nanotube composite material is an insulative material.

3. The thin film transistor according to claim 1, wherein a top surface of the heat dissipation layer is coated with a hydrophobic organic film layer; or the top surface of the heat dissipation layer is subjected to plasma treatment.

4. The thin film transistor according to claim 1, further comprising:
   a substrate; and
   a buffer layer arranged on the substrate,
   wherein the source electrode pattern, the drain electrode pattern and the heat dissipation layer are arranged on the buffer layer.

5. The thin film transistor according to claim 1, further comprising:
   an organic semiconductor layer arranged on the source electrode pattern, the drain electrode pattern and the heat dissipation layer;
   a first organic dielectric insulation layer arranged on the organic semiconductor layer; and
   a gate electrode layer arranged on the first organic dielectric insulation layer.

6. The thin film transistor according to claim 5, further comprising:
   a second organic dielectric insulation layer arranged between the first organic dielectric insulation layer and the gate electrode layer.

7. The thin film transistor according to claim 1, wherein the polymer carbon nanotube composite material is a material formed by filling pore passages which are evenly or unevenly distributed in an insulative polymer matrix with carbon nanotubes gathered through a phase separation effect.

8. A manufacturing method of a thin film transistor, the thin film transistor comprising a source electrode pattern and a drain electrode pattern arranged on a same layer, wherein the method comprises:
   forming a heat dissipation layer pattern having a predetermined electrical conductivity between the source electrode pattern and the drain electrode pattern,
   wherein the heat dissipation layer is made of a polymer carbon nanotube composite material.

9. The method according to claim 8, wherein
   the polymer carbon nanotube composite material is a material formed by filling pore passages which are evenly or unevenly distributed in an insulative polymer matrix with carbon nanotubes gathered through a phase separation effect.

10. The method according to claim 8, further comprising:
    coating a top surface of the heat dissipation layer with a hydrophobic organic film layer; or
    subjecting the top surface of the heat dissipation layer to plasma treatment.

11. The method according to claim 8, wherein before forming the heat dissipation layer pattern, the method further comprises:
    forming a buffer layer pattern on a substrate;
    forming the source electrode pattern and the drain electrode pattern on the buffer layer pattern.

12. The method according to claim 8, further comprising:
    forming an organic semiconductor layer pattern on the source electrode pattern, the drain electrode pattern and the heat dissipation layer pattern;
    forming a first organic dielectric insulation layer pattern on the organic semiconductor layer pattern; and
    forming a gate electrode layer pattern on the first organic dielectric insulation layer pattern.

13. The method according to claim 12, wherein before forming the gate electrode layer pattern, the method further comprises:
    forming a second organic dielectric insulation layer pattern on the first organic dielectric insulation layer pattern, wherein the gate electrode layer pattern is arranged on the second organic dielectric insulation layer.

14. A thin film transistor, comprising a source electrode pattern and a drain electrode pattern arranged on a same layer, wherein the thin film transistor further comprises:
    a heat dissipation layer arranged between the source electrode pattern and the drain electrode pattern,
    wherein a top surface of the heat dissipation layer is coated with a hydrophobic organic film layer; or the top surface of the heat dissipation layer is subjected to plasma treatment.

15. The thin film transistor according to claim 14, further comprising:
    a substrate; and
    a buffer layer arranged on the substrate,
    wherein the source electrode pattern, the drain electrode pattern and the heat dissipation layer are arranged on the buffer layer.

16. The thin film transistor according to claim 14, further comprising:
    an organic semiconductor layer arranged on the source electrode pattern, the drain electrode pattern and the heat dissipation layer;
    a first organic dielectric insulation layer arranged on the organic semiconductor layer; and
    a gate electrode layer arranged on the first organic dielectric insulation layer.

17. The thin film transistor according to claim 16, further comprising:
   a second organic dielectric insulation layer arranged between the first organic dielectric insulation layer and the gate electrode layer.

18. The thin film transistor according to claim 14, wherein the heat dissipation layer is a polymeric insulative material.

19. The thin film transistor according to claim 17, wherein the polymeric insulative layer is made of a polymer carbon nanotube composite material.

* * * * *